United States Patent
Yoshida et al.

(10) Patent No.: US 9,328,261 B2
(45) Date of Patent: May 3, 2016

(54) POLISHING AGENT, POLISHING METHOD, AND MANUFACTURING METHOD OF SEMICONDUCTOR INTEGRATED CIRCUIT DEVICE

(71) Applicant: ASAHI GLASS COMPANY, LIMITED, Chiyoda-ku (JP)

(72) Inventors: Yuiko Yoshida, Chiyoda-ku (JP); Iori Yoshida, Chiyoda-ku (JP); Junko Anzai, Chiyoda-ku (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 0 days.

(21) Appl. No.: 14/566,928

(22) Filed: Dec. 11, 2014

(65) Prior Publication Data

US 2015/0175848 A1 Jun. 25, 2015

(30) Foreign Application Priority Data

Dec. 24, 2013 (JP) .................................. 2013-266112
Nov. 14, 2014 (JP) .................................. 2014-231561

(51) Int. Cl.
*B24B 37/04* (2012.01)
*C09G 1/02* (2006.01)
*H01L 21/304* (2006.01)

(52) U.S. Cl.
CPC .............. *C09G 1/02* (2013.01); *B24B 37/044* (2013.01); *H01L 21/304* (2013.01)

(58) Field of Classification Search
CPC ....... B24B 37/044; C09G 1/02; H01L 21/304
USPC .......................................................... 451/41
See application file for complete search history.

(56) References Cited

U.S. PATENT DOCUMENTS

| | | | | |
|---|---|---|---|---|
| 5,543,126 A | * | 8/1996 | Ota | B82Y 30/00 423/263 |
| 5,747,382 A | * | 5/1998 | Huang | H01L 21/76819 257/E21.244 |
| 5,766,279 A | * | 6/1998 | Ueda | C09G 1/02 106/3 |

(Continued)

FOREIGN PATENT DOCUMENTS

| EP | 0 875 547 A2 | 11/1998 |
|---|---|---|
| JP | 8-81218 | 3/1996 |

(Continued)

OTHER PUBLICATIONS

U.S. Appl. No. 14/559,997, filed Dec. 4, 2014, Yoshida, et al.

(Continued)

*Primary Examiner* — George Nguyen
(74) *Attorney, Agent, or Firm* — Oblon, McClelland, Maier & Neustadt, L.L.P.

(57) ABSTRACT

A first polishing agent contains: cerium oxide particles; and water, wherein, in IR spectrum of the cerium oxide particle, a value A found by a formula below from a ratio (I/I') between a value I of an absorbance of 3566 $cm^{-1}$ and a value I' of an absorbance of 3695 $cm^{-1}$, and a crystallite diameter XS, is 0.08 or less.

$$A=(I/I')/XS$$

A second polishing agent contains: cerium oxide particles; and water, wherein, in the cerium oxide particle, a deviation B of a lattice constant found by a formula below from a theoretical lattice constant (a') and a lattice constant (a) measured by powder X-ray diffraction, is −0.16% or more.

$$B(\%)=(1-a/a')\times 100$$

11 Claims, 2 Drawing Sheets

(56) References Cited

U.S. PATENT DOCUMENTS

| | | | | |
|---|---|---|---|---|
| 5,926,713 | A * | 7/1999 | Hause | H01L 21/31053 257/E21.244 |
| 5,951,724 | A * | 9/1999 | Hanawa | C09G 1/02 257/E21.244 |
| 6,338,744 | B1 * | 1/2002 | Tateyama | C09K 3/1463 451/38 |
| 6,551,175 | B2 * | 4/2003 | Koichi | B24B 37/044 257/E21.304 |
| 8,030,381 | B2 * | 10/2011 | Kimura | C08K 5/0091 524/141 |
| 2004/0031206 | A1 * | 2/2004 | Uchino | C09G 1/02 51/307 |
| 2005/0003744 | A1 * | 1/2005 | Feng | B82Y 30/00 451/41 |
| 2007/0251270 | A1 | 11/2007 | Miyatani et al. | |

FOREIGN PATENT DOCUMENTS

| | | |
|---|---|---|
| JP | 2000-109803 | 4/2000 |
| JP | 2007-153731 A | 6/2007 |
| TW | 311905 B | 8/1997 |
| WO | WO 2007/043817 A1 | 4/2007 |

OTHER PUBLICATIONS

U.S. Appl. No. 14/563,137, filed Dec. 8, 2014, Yoshida, et al.

Extended European Search Report issued May 19, 2015 in Patent Application No. 14004328.2.

Branko Matović, et al., "Synthesis, calcination and characterization of Nanosized ceria powders by self-propagating room temperature method" Ceramics International, vol. 39, No. 5, XP28526844A, Dec. 7, 2012, pp. 5007-5012.

* cited by examiner

POLISHING AGENT, POLISHING METHOD, AND MANUFACTURING METHOD OF SEMICONDUCTOR INTEGRATED CIRCUIT DEVICE

CROSS REFERENCE TO RELATED APPLICATION

This application is based upon and claims the benefit of priority from the prior Japanese Patent Application No. 2013-266112, filed on Dec. 24, 2013, and Japanese Patent Application No. 2014-231561, filed on Nov. 14, 2014; the entire contents of which are incorporated herein by reference.

FIELD

Embodiments disclosed here relate to a polishing agent, a polishing method using that polishing agent, and a manufacturing method of a semiconductor integrated circuit device in which that polishing method is used.

BACKGROUND

Because of a tendency of high density and high definition of a semiconductor element, development of a higher microfabrication technique is demanded in recent years. Conventionally, in manufacturing of a semiconductor integrated circuit device (hereinafter, also referred to as a semiconductor device), planarization of an interlayer insulation film, a copper-embedded wiring, or the like has been carried out by using chemical mechanical polishing (hereinafter, referred to as CMP), in order to prevent a problem that unevenness (level difference) of a layer surface exceeds a depth of focus of lithography and hampers obtaining a sufficient resolution. Importance of such planarization by CMP increases all the more as demand for high resolution or miniaturization of a semiconductor element becomes severer.

Further, in manufacturing of a semiconductor device, a isolation method (shallow trench isolation, hereinafter, referred to as STI) by a shallow trench with a small element isolation width is introduced in recent years in order to advance more sophisticated miniaturization of a semiconductor element.

STI is a technique to form an electrically insulated element region by forming a trench in a silicon substrate and embedding an insulation film in the trench. In STI, first, as shown in FIG. 1A, after an element region of a silicon substrate 1 is masked by a silicon nitride film 2 or the like, a trench 3 is formed in the silicon substrate 1 and an insulation film such as a silicon oxide film 4 or the like is deposited to fill the trench 3. Next, by CMP, the silicon oxide film 4 on the silicon nitride film 2 being a convex part is polished and removed while the silicon oxide film 4 in the trench 3 being a concave part is left, whereby an element isolation structure in which the silicon oxide film 4 is embedded in the trench 3 is obtained as shown in FIG. 1B. In CMP as above, by a configuration where a selectivity (polishing rate of silicon oxide film/polishing rate of silicon nitride film) between a polishing rate of the silicon oxide film 4 and a polishing rate of the silicon nitride film 2 is made sufficiently high so that polishing may finish at a time that the silicon nitride film 2 is exposed, a smoother surface can be obtained.

In manufacturing of a semiconductor device, other than planarization of the silicon oxide film in STI as above, CMP is carried out by using a polishing agent which contains abrasive particles of fumed silica, colloidal silica, alumina, ceria (cerium oxide) or the like, in order to planarize an insulation film of a silicon oxide or a ferroelectric film for capacitor formed by various methods such as plasma-CVD (chemical vapor deposition), low pressure-CVD, sputtering, and electroplating. As miniaturization and high definition of an element advances, a defect (hereinafter, referred to as a polishing defect) formed in an interlayer insulation film or an insulation film for STI at a time of polishing becomes increasingly a large problem, since the defect causes wiring short circuit or the like and leads to reduction of a yield.

Conventionally, when a surface to be polished is an insulation film made of a silicon oxide or the like, a polishing agent which contains high-purity cerium oxide particles have been used since the high-purity cerium oxide particles have lower hardness compared with silica-based abrasive particles and hard to cause a polishing defect (refer to JP-A 2000-109803, for example).

However, in response to further miniaturization of a semiconductor integrated circuit, demand for prevention of a polishing defect becomes further higher, and the polishing agent described in JP-A 2000-109803 cannot sufficiently respond to such demand. Thus, it is proposed that a particle diameter of a cerium oxide being an abrasive particle should be made smaller (refer to JP-A H08-081218, for example). However, when cerium oxide particles with a small particle diameter are used as abrasive particles, a polishing rate is reduced, and there is a problem that an efficiency of polishing operation is significantly worsened.

DETAILED DESCRIPTION

Figure 1A:
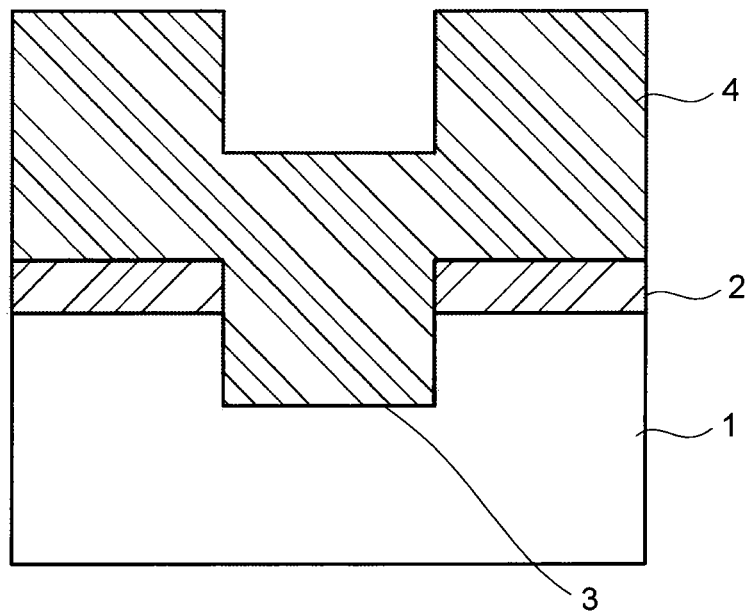
FIG. 1A and FIG. 1B are cross-sectional views of a semiconductor substrate showing a method of polishing by CMP in STI.
Figure 1B:
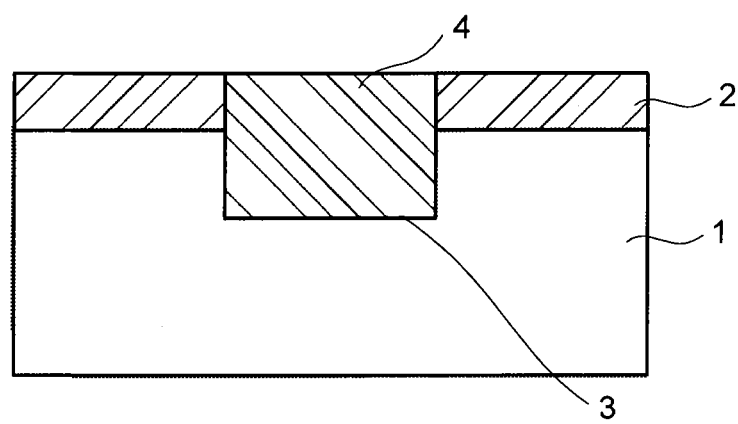

The present invention is made to solve the above-described problem, and an object thereof is to provide a polishing agent capable of suppressing occurrence of a polishing defect to a surface to be polished and of polishing in a short time in CMP for planarization of an insulation film for STI, for example, as well as a polishing method.

A polishing agent of a first embodiment of the present invention comprises: cerium oxide particles; and water, wherein, in the cerium oxide particle, a value A found by a formula below from a ratio (I/I') between a value I of an absorbance of 3566 cm$^{-1}$ and a value I' of an absorbance of 3695 cm$^{-1}$, with an absorbance of 3900 cm$^{-1}$ of an infrared absorption spectrum as a criterion, and a crystallite diameter XS measured by X-ray diffraction is 0.08 or less.

$$A = (I/I')/XS$$

In the first embodiment of the polishing agent, the crystallite diameter XS of the cerium oxide particle is preferable to be 20 nm or more to 60 nm or less. Further, in the cerium oxide particle, a ratio (XS/D) between the crystallite diameter XS and an average primary particle diameter D obtained by a scanning electron microscope is preferable to be 0.4 or more to 1.0 or less. Further, the average primary particle diameter D of the cerium oxide particles is preferable to be 30 nm or more to 100 nm or less.

A polishing agent of a second embodiment of the present invention comprises: cerium oxide particles; and water, wherein, in the cerium oxide particle, a deviation B of a lattice constant found by a formula below from a theoretical lattice constant (a') and a lattice constant (a) measured by powder X-ray diffraction, is −0.16% or more, and an average secondary particle diameter D' of said cerium oxide particles is 90 nm or more to 500 nm or less.

$$B(\%)=(1-a/a')\times 100$$

In the second embodiment of the polishing agent, the average secondary particle diameter D' of said cerium oxide particles is preferable to be 95 nm or more to 250 nm or less, and is more preferable to be 95 nm or more to 200 nm or less.

A polishing method of the present invention comprises polishing by a relative motion between a surface to be polished and a polishing pad which are brought into contact with each other while a polishing agent is supplied to the polishing pad, wherein the polishing agent of the present invention is supplied to the polishing pad.

A manufacturing method of a semiconductor integrated circuit device of the present invention comprises a step of polishing the surface to be polished by the polishing method of the present invention.

In the present invention, a "surface to be polished" means a surface to be polished of a polishing target, and means a front surface, for example. In manufacturing of a semiconductor device, the "surface to be polished" includes a substrate surface in an intermediate stage appearing in a manufacturing process.

According to the polishing agent and the polishing method of the present invention, it is possible to polish a surface to be polished which includes a film of a silicon oxide, a silicon oxide containing carbon, a silicon nitride, a silicon oxynitride, a silicon carbide, amorphous silicon, polysilicon, or the like at a high polishing rate while suppressing occurrence of a polishing defect. Besides, it is possible to perform planarization of an insulation film for STI, for example, at a high polishing rate while suppressing occurrence of the polishing defect, so that a manufacturing efficiency of the semiconductor device can be heightened.

Hereinafter, the present invention will be described. The present invention is not limited to the following embodiment, and another embodiment can also belong to the category of the present invention as long as the embodiment complies with the spirit of the present invention.

[Polishing Agent]

A polishing agent (hereinafter, a first polishing agent) of a first embodiment of the present invention is a polishing agent for performing CMP to a surface to be polished which includes a film of a silicon oxide, a silicon oxide containing carbon, a silicon nitride, a silicon oxynitride, a silicon carbide, amorphous silicon, polysilicon, or the like, and the first polishing agent contains cerium oxide particles and water, the cerium oxide particle having a predetermined characteristic value related to an infrared absorption (IR) spectrum. A polishing agent (hereinafter, a second polishing agent) of a second embodiment of the present invention is a polishing agent for performing CMP to a surface to be polished which includes a film of a silicon oxide, a silicon oxide containing carbon, a silicon nitride, a silicon oxynitride, a silicon carbide, amorphous silicon, polysilicon, or the like, as well as the first polishing agent, the second polishing agent contains cerium oxide particles and water, the cerium oxide particle having a predetermined characteristic value related to a lattice constant, and a predetermined value related to an average secondary particle diameter D'. The first polishing agent and the second polishing agent of the present invention are suitable particularly for CMP of a silicon oxide film (concretely, a silicon dioxide film) in STI.

(Cerium Oxide Particles)

The cerium oxide particle contained in the first polishing agent is one whose index value A indicated below is 0.08 or less. The index value A is a value found by the following formula from a ratio (absorbance ratio) $I_0$ of intensities of predetermined two absorption peaks in the IR spectrum of the cerium oxide particle, and a crystallite diameter XS obtained by X-ray diffraction.

$$A=I_0/XS$$

Here, the absorbance ratio $I_0$ is a ratio (I/I') between I and I' when a value of an absorbance of 3566 cm$^{-1}$ is I and a value of an absorbance of 3695 cm$^{-1}$ is I'. In other words, the index value A is found by the following.

$$A=(I/I')/XS$$

Note that both the absorbance I and the absorbance I' are values when an absorbance of 3900 cm$^{-1}$ in the IR spectrum of the cerium oxide particle is a reference (zero).

In the IR spectrum of the cerium oxide particle, an absorption peak in a neighborhood of 3566 cm$^{-1}$ is an absorption deriving from vibration of a hydrogen bond between a plurality of OH groups existing in the cerium oxide particle, and an absorption existing in a neighborhood of 3695 cm$^{-1}$ is an absorption deriving from vibration of a bond between O and H in an isolated OH group, and thus it means that the smaller an absorbance ratio $I_0$ of these absorption peaks is, in other words, I/I', the smaller an entire amount of OH groups existing in the cerium oxide particle is.

Further, it is conceived that the fewer the OH groups existing in the cerium oxide particle is, the higher polishing rate of a silicon oxide film can be obtained, and an amount of the OH groups existing in the cerium oxide particle depending on a particle diameter, the entire amount of the OH groups per one cerium oxide particle is large in the particle with a large particle diameter. As described above, since a degree of smallness in amount of the OH groups existing in the cerium oxide particle depends on the particle diameter of the cerium oxide particle, the smallness in amount leading to improvement of the polishing rate, it is difficult to judge only by the value of the absorbance ratio (I/I'). In contrast, a value obtained by dividing the absorbance ratio (I/I') by a crystallite diameter XS is less dependent on the particle size of the cerium oxide particle, and is a numerical value almost indicating largeness/smallness in amount of the OH groups existing in the cerium oxide particle. Therefore, this value A can be an index of the amount of the OH groups existing in the cerium oxide particle.

When the index value A is 0.08 or less, the amount of the OH groups of the cerium oxide particle is sufficiently small independently of the size of the particle diameter of the cerium oxide particle, and a sufficiently high polishing rate can be obtained in polishing of a silicon dioxide film in STI.

The crystallite diameter XS of the cerium oxide particle is preferable to be 20 nm or more to 60 nm or less. Here, for the crystallite diameter XS, an X-ray diffraction spectrum of the cerium oxide particle is measured by an X-ray diffractometer and a half value width of a (111) surface is found in the obtained spectrum, and the crystallite diameter XS is calculated from that value by a formula of Scherrer shown below.

crystallite diameter (nm)=(Scherrer constant×X-ray wavelength (m))/(half value width (2θ)×cos diffraction angle)/10

Note that as the Scherrer constant, 0.94 is used.

When the crystallite diameter XS is 20 nm or more to 60 nm or less, a sufficiently high polishing rate of a silicon dioxide film can be obtained and occurrence of a polishing defect can also be suppressed. The crystallite diameter XS of the cerium oxide particle is preferable to be 30 nm or more to 60 nm or less, and is more preferable to be 40 nm or more to 60 nm or less.

In the cerium oxide particle, a ratio (XS/D) between the crystallite diameter XS as above and an average primary particle diameter D is preferable to be 0.4 or more to 1.0 or less. A value (XS/D) of this ratio indicates a degree of a single crystal of a cerium oxide, and the degree of the single crystal becomes higher as the value (XS/D) comes close to 1 (one), so that a sufficiently large polishing rate of the silicon dioxide can be obtained. Here, the average primary particle diameter D is a particle diameter obtained by observation with using a scanning electron microscope (SEM), and is found by image-analyzing an image of the cerium oxide particle obtained by the SEM and calculating a number average particle diameter.

Further, the average primary particle diameter D of the cerium oxide particle is preferable to be 30 nm or more to 100 nm or less, and is more preferable to be 60 nm or more to 100 nm or less. When the average primary particle diameter D is 30 nm or more to 100 nm or less, a sufficient polishing rate can be obtained and occurrence of a polishing defect such as a scratch in a surface to be polished can be suppressed. Note that when the average primary particle diameter D is less than 30 nm, there is a case where aggregation is apt to occur depending on a condition of a pH, a concentration of an additive, or the like.

The cerium oxide particle contained in the second polishing agent is one whose the deviation value B being an index indicating a degree of a deviation from a theoretical value of a lattice constant is −0.16% or more, and whose an average secondary particle diameter D' is 90 nm or more to 500 nm or less. Here, the deviation value B is found by a formula below from the lattice constant (a') found theoretically and the lattice constant (a) obtained by measurement of a powder X-ray diffraction spectrum, for a cerium oxide crystal.

$$B(\%)=(1-a/a')\times 100$$

Note that in measurement of the powder X-ray diffraction spectrum, the lattice constant (a) is found by a formula below.

$$a=n\lambda/2 \sin\theta$$

In the above formula, "$\lambda$" represents a wavelength of an X-ray and "n" represents the number of diffraction, respectively.

The lattice constant is a parameter indicating a shape and a size of a unit lattice of a crystal. When lengths (cycles of repetition along respective directions of three crystal axes) of respective edges (axes) of the unit lattice are represented by "a", "b", "c" and angles made thereby with each other are represented by "$\alpha$", "$\beta$", "$\gamma$", the lattice constant is a group of these six. However, a crystal of a cerium oxide is a cubic crystal and a=b=c as well as $\alpha=\beta=\gamma=90°$, it is possible to refer to a value of "a" only as a lattice constant.

In the crystal of the cerium oxide, when a defect of oxygen occurs, electric repulsion between cerium ions becomes stronger, and the lattice constant comes to be larger than the theoretical value (a'). Therefore, the lattice constant (a) of the cerium oxide particle obtained by measurement of the powder X-ray diffraction spectrum is equal to or more than the theoretical value a', and it means that as the lattice constant (a) becomes larger the defect of oxygen has been increased.

In the cerium oxide particle, when the deviation value B from the theoretical value of the lattice constant represented by the aforementioned formula is −0.16% or more, oxygen defect in the cerium oxide crystal is sufficiently small. By using a polishing agent containing the cerium oxide particle with small oxygen defect as above, a sufficiently large polishing rate can be obtained.

Further, the cerium oxide particle contained in the second polishing agent has an average secondary particle diameter D' of 90 nm or more to 500 nm or less. When the average secondary particle diameter D' of the cerium oxide particle is 90 nm or more to 500 nm or less, a sufficient polishing rate to a silicon dioxide film can be obtained and occurrence of a polishing defect in a surface to be polished can be suppressed. The average secondary particle diameter D' of the cerium oxide particle is preferable to be 95 nm or more to 250 nm or less, and is more preferable to be 95 nm or more to 200 nm or less. When the average secondary particle diameter D' is less than 90 nm, influence of the deviation from the theoretical value of the lattice constant to polishing is too small, and when the average secondary particle diameter D' is more than 500 nm, a polishing defect in a surface to be polished is likely to be caused.

In order to obtain the cerium oxide particles contained in the first polishing agent or the second polishing agent, it is preferable to manufacture cerium oxide particles or a slurry containing cerium oxide particles by methods (1) to (3) described later, and to apply (i) a heating processing or (ii) an injecting colliding processing to the obtained cerium oxide particles or slurry containing the cerium oxide particles.

(Manufacturing of Cerium Oxide Particles)

The aforementioned cerium oxide particles before the heating or injecting colliding processing can be obtained by the methods shown below, for example.

(1) After a cerium hydroxide gel is generated by adding an alkali such as an ammonia aqueous solution to a cerium (III) nitrate aqueous solution, a heating processing is carried out, whereby a slurry containing cerium oxide particles can be obtained. The slurry obtained as above is filtrated, washed, and dried, so that cerium oxide particles can be obtained.

(2) After a cerium hydroxide gel is generated by adding an alkali such as an ammonia aqueous solution to a cerium (IV) nitride ammonium aqueous solution, chemical oxidation is carried out, whereby a slurry containing cerium oxide particles can be obtained. The slurry obtained as above is filtrated, washed, and dried, so that cerium oxide particles can be obtained.

(3) A cerium (III) salt is chemically oxidized in a liquid, and a slurry containing cerium oxide particles is obtained. The slurry obtained as above is filtrated, washed, and dried, so that cerium oxide particles can be obtained.

(Preparation of Slurry Containing Cerium Oxide)

The slurry containing the cerium oxide in the present invention contains water as a medium dispersing the cerium oxide particles. Water is not particularly limited, and pure water, ultrapure water, ion-exchange water, or the like is preferable in view of prevention of influence to another additive, mixture of impurities, and influence to a pH or the like. A content of water is preferable to be 50 mass % or more to 99.9 mass % or less in ratio to the entire slurry, and is further preferable to be 60 mass % or more to 99.8 mass % or less. Further, a content ratio (concentration) of the cerium oxide particles is preferable to be 0.1 mass % or more to 50 mass % or less to the entire slurry, and is more preferable to be 0.2 mass % or more to 40 mass % or less, in view of efficiency of polishing and prevention of aggregation of particles.

The slurry can be prepared by adding the aforementioned preferable amount of water to the cerium oxide particles obtained by (1) to (3) described above, for example. Further, a later-described pH adjusting agent, dispersing agent, or the like can be added to the slurry as necessary. Alternately, usable is the slurry fabricated in a stage before the cerium oxide particles is obtained in (1) to (3) described above.

Next, to the cerium oxide particles or the slurry containing the cerium oxide particles obtained as above, (i) the heating processing or (ii) the injecting colliding processing described below is applied, whereby the cerium oxide particles having the predetermined value described above can be obtained.

(i) Heating Processing

In the heating processing, the cerium oxide particles or the slurry containing the cerium oxide particles (hereinafter, simply referred to as a slurry) is heated at 90° C. or more to 1000° C. or less. When the slurry is to be used, it is preferable to contain water as a medium which disperses the cerium oxide particles.

A heating method of the cerium oxide particles or the slurry is not particularly limited as long as heating is performed at the above-descried heating temperature. As the method of heating the slurry, there can be cited a method of boiling, a method of heating by injecting into a high-temperature atmosphere, a method of heating by using an autoclave, and so on. Further, there can be cited a method of heating by irradiating a microwave to the slurry by using a microwave vibrator, and so on. In the method of injecting into the high-temperature atmosphere, heating can be carried out in quite a short time as a result that the slurry is brought into contact with the high-temperature atmosphere in a state of fog drop. A temperature of the high-temperature atmosphere can be 90° C. or more to 1000° C. or less, for example. In the method of heating by the autoclave, higher temperature can be obtained even in a slurry state as a result of heating under a pressure higher than an atmospheric pressure, and, for example, a set temperature of the autoclave can be 90° C. or more to 250° C. or less. In the method of irradiating the microwave to the slurry by using the microwave vibrator, the temperature can be 90° C. or more to 300° C. or less, for example.

Further, in the heating processing, the cerium oxide particles may be directly heated. In such a case, for example, the cerium oxide particles obtained by the aforementioned (1) to (3) can be directly heated. Direct heating can be performed by holding the cerium oxide particles in a firing furnace whose temperature is set to be at the above-described firing temperature or higher. A heating time (holding time in the firing furnace) on such an occasion is preferable to be one hour or more to twenty-four hours or less. The heating temperature (a set temperature of the firing furnace), which differs depending on a kind or the like of the firing furnace to be used, is preferable to be 90° C. or more to 1000° C. or less. The firing furnace is not particularly limited, and a gas furnace, an electric furnace, a plasma furnace, or the like can be used.

To the cerium oxide particles or the slurry including the cerium oxide particle having been subjected to (i) the heating processing as above, it is possible to further perform (ii) the injecting colliding processing described later.

(ii) Injecting Colliding Processing

An injecting colliding processing method has a step of injecting a slurry containing cerium oxide particles and water at a predetermined pressure and a step of colliding the injected slurry against a rigid body having a predetermined hardness or colliding the injected slurries against each other. Note that, as the rigid body, a spherical body constituted with a silicon nitride can be cited, for example.

The slurry to be injected, the slurry containing the cerium oxide particles and water, can be prepared by adding a preferable amount of water to the cerium oxide particle obtained by (1) to (3) described above, for example. Further, a later-described pH adjusting agent, dispersing agent, or the like can be added to the slurry containing the cerium oxide particles and water as necessary. Alternately, usable as the slurry in the present invention is the slurry having been fabricated in a stage before the cerium oxide particles are obtained, in (1) to (3) described above.

In the injecting colliding processing, by colliding the slurry and the rigid body or by colliding the injected slurries against each other in the colliding step, kinetic energy of the injected slurry is converted into thermal energy, and the generated thermal energy heats the cerium oxide particles in the slurry.

In the injecting colliding processing, it is preferable that the slurry after collision is supplied to the injecting step and that the injecting step and the colliding step are performed again. In such a case, the injecting step and the colliding step are preferable to be repeated multiple times (passes), and the number of repeating is preferable to be one to forty (pass(es)) and is more preferable to be one to 30 (passes).

As an injecting colliding processing apparatus, a wet jet mill is suitable, and, for example, a Star Burst series manufactured by SUGINO MACHINE LIMITED or the like can be used.

(Dispersion Medium)

The first polishing agent and the second polishing agent of the present invention (hereinafter, the polishing agent of the present invention) contains water as a medium dispersing the cerium oxide particles having the predetermined characteristic value obtained as above. Water is not particularly limited, and pure water, ultrapure water, ion-exchange water, or the like is preferable in view of prevention of influence to another additive, mixture of impurities, and influence to a pH or the like. A content of water is preferable to be 50 to 99.9 mass % in rate to the entire polishing agent, is more preferable to be 70 to 99.9 mass %, and is particularly preferable to be 90 to 99.9 mass %. Further, a content rate of the cerium oxide particles is preferable to be 0.1 to 50 mass % to the entire polishing agent, is more preferable to be 0.1 to 30 mass %, and is further preferable to be 0.1 to 10 mass %, in view of efficiency of polishing and prevention of aggregation of particles.

(pH)

A pH of the polishing agent of the present invention is preferable to be 3.5 to 11, and is further preferable to be within a range of 3.5 to 10. When the pH is 3 or less, the polishing rate is substantially reduced. Further, when the pH exceeds 11, dispersion stability of the cerium oxide particles being abrasive particles is hard to be maintained. When the pH of the polishing agent is within a range of 3.5 to 11, dispersion stability of the cerium oxide particles is good and a high polishing rate can be obtained.

The polishing agent of the present invention can contain various kinds of inorganic acids or inorganic acid salts as a pH adjusting agent for adjusting the pH to be within the above-described predetermined range. The inorganic acid or the inorganic acid salt is not particularly limited, and there can be used, for example, a nitric acid, a sulfuric acid, a hydrochloric acid, a phosphoric acid, a boric acid, a carbonic acid, and an ammonium salt thereof or a potassium salt thereof, and so on.

Further, the polishing agent of the present invention can contain various kinds of basic compounds as the pH adjusting agent. The basic compound is preferable to be water-soluble, but is not particularly limited. It is possible to use, for example, ammonia, potassium hydroxide, and quaternary ammonium hydroxide such as tetramethylammonium hydroxide (TMAH) and tetraethylammonium hydroxide, and so on.

The polishing agent of the present invention can contain a component other than the above-described component. As another component, a dispersing agent or the like can be cited. The dispersing agent is contained in order to disperse cerium oxide particles stably in a dispersion medium such as pure water, and an anionic, cationic, nonionic, or amphoteric surfactant can be used. The polishing agent of the present invention can contain one kind or more of these components.

(Preparation of Polishing Agent)

To prepare the polishing agent of the present invention, water as the dispersing agent is added to the cerium oxide particles or the slurry containing the cerium oxide particles to which the above-described (i) heating processing or (ii) injecting colliding processing has been applied and which is adjusted to have the above-described predetermined characteristic value. A content of water is preferable to be 50 to 99.9 mass % in ratio to the entire polishing agent, and is further preferable to be 80 to 99.9 mass %. A content rate of the cerium oxide particles is preferable to be 0.1 to 5 mass % in relation to the entire of the polishing agent, and is more preferable to be 0.15 to 3 mass %, in view of efficiency of polishing and prevention of aggregation of particles.

In a case where the slurry containing the cerium oxide particle is subjected to the heating processing in order to obtain the cerium oxide particles having the predetermined characteristic value, as long the content of water in the slurry after the heating processing is within the above-described preferable range, that slurry can be used as a polishing agent as it is. Further, it is possible to make the content of water in the polishing agent be the above-described preferable amount by adding water as necessary after the heating processing is performed to the slurry.

In order to improve dispersibility of the cerium oxide particles, it is preferable to perform a dispersing processing to the polishing agent obtained by the above, by using a homogenizer. After the dispersing processing by the homogenizer, it is also possible to perform a processing by a wet jet mill in order to further raise the dispersibility.

<Polishing Method and Polishing Apparatus>

When polishing a surface to be polished which includes a film of a silicon oxide, a silicon oxide containing carbon, a silicon nitride, a silicon oxynitride, a silicon carbide, amorphous silicon, polysilicon, or the like of a semiconductor device by using the polishing agent of the present invention, a method is preferable in which polishing is performed by a relative motion between the surface to be polished and a polishing pad which are brought into contact with each other while the polishing agent is supplied to the polishing pad.

Figure 2:
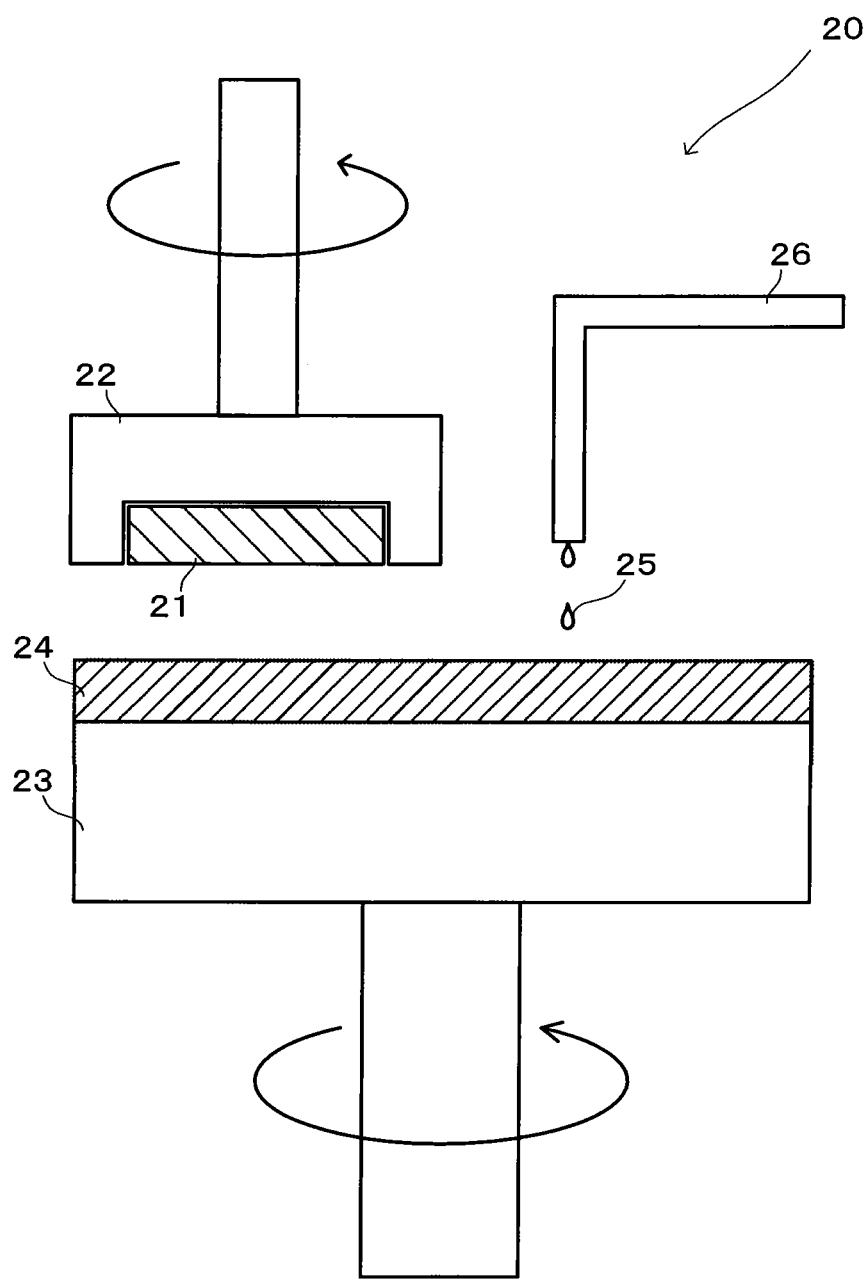
FIG. 2 is a diagram showing an example of a polishing apparatus usable for a polishing method of the present invention.

In the above-described polishing method, as for a polishing apparatus, a known polishing apparatus can be used. FIG. 2 is a diagram showing an example of the polishing apparatus usable for the polishing method of the present invention.

The polishing apparatus 20 has a polishing head 22 to hold a semiconductor device 21, a polishing platen 23, a polishing pad 24 set on a surface of the polishing platen 23, and a polishing agent supply piping 26 to supply a polishing agent 25 to the polishing pad 24. It is configured that a surface to be polished of the semiconductor device 21 held by the polishing head 22 is brought into contact with the polishing pad 24 to perform polishing by a relative rotational motion of the polishing head 22 and the polishing platen 23 while the polishing agent 25 is being supplied from the polishing agent supply piping 26. Note that the polishing apparatus used in the present invention is not limited to one having such a structure.

The polishing head 22 may make not only a rotational motion but also a linear motion. Further, the polishing platen 23 and the polishing pad 24 may have a size nearly equal to or smaller than a size of the semiconductor device 21. In that case, it is preferable to configure that an entire surface of the surface to be polished of the semiconductor device 21 is able to be polished by a relative motion of the polishing head 22 and the polishing platen 23. Further, the polishing platen 23 and the polishing pad 24 are not necessarily ones which make rotational motions, and may be ones which move in one direction by a belt system, for example.

A condition of polishing by such a polishing apparatus 20 is not particularly limited, and a polishing pressure can be further heightened to improve the polishing rate by giving a load to the polishing head 22 in pressing against the polishing pad 24. The polishing pressure is preferable to be about 0.5 to 50 kPa, and is more preferable to be about 3 to 40 kPa, in view of uniformity of the polishing rate, flatness, and prevention of a polishing defect such as a scratch in the surface to be polished of the semiconductor device 21. Numbers of rotations of the polishing platen 23 and the polishing head 22 are preferable to be about 50 to 500 rpm, but is not limited thereto. Further, a supply amount of the polishing agent 25 is appropriately adjusted according to a composition of the polishing agent, the above-described polishing condition, and so on.

As the polishing pad 24, one made of nonwoven fabric, foamed polyurethane, a porous resin, a nonporous resin, or the like is usable. Further, in order to accelerate supply of the polishing agent 25 to the polishing pad 24 or to make a predetermined amount of the polishing agent 25 stay in the polishing pad 24, the surface of the polishing pad 24 may be subjected to a grooving processing of a lattice-shape, a concentric shape, a spiral shape, or the like. Further, as necessary, polishing may be performed while a pad conditioner is brought into contact with the surface of the polishing pad 24 to perform conditioning of the surface of the polishing pad 24.

According to the polishing method of the present invention, a surface to be polished made of a silicon oxide can be polished at a high polishing rate in a CMP processing such as planarization of an interlayer insulation film and planarization of an insulation film for STI in manufacturing of a semiconductor device. Further, it is possible to suppress occurrence of a polishing defect to the surface to be polished, so that a semiconductor device can be obtained at a high yield.

EXAMPLES

Hereinafter, the present invention will be described concretely based on examples, but the present invention is not limited to the following description. Examples 1 to 5 and an example 10 are working examples of the present invention, while examples 6 to 9 are comparative examples.

In the following examples, "%" means "mass %" unless mentioned otherwise. Further, a concentration of abrasive particles, an average primary particle diameter (D), an average secondary particle diameter, a crystallite diameter (XS), absorbances (I, I') and an absorbance ratio (I/I') of absorption peaks in an IR spectrum, and a lattice constant (a) and a deviation value B (%) from a theoretical value of the lattice constant of a cerium oxide particle are each measured by the following methods.

(Concentration of Abrasive Particles)

A concentration of the abrasive particles was measured by using a moisture meter (manufactured by SHIMADZU Co., apparatus name; MOC-120H).

(Average Primary Particle Diameter D)

An average primary particle diameter D was found by analyzing an image of cerium oxide particles obtained by a scanning electron microscope (SEM) (manufactured by Hitachi High-Technologies Co., apparatus name: S-4800) by using image analysis software (manufactured by Mountech Co., Ltd., trade name: Mac-View ver. 3.5). Analysis was carried out by approximating the image of the particle to a circle, particle diameters of the 50 particles in the image were measured, and a value obtained by number-averaging was adopted as an average primary particle diameter D.

(Average Secondary Particle Diameter)

An average secondary particle diameter D' was measure by using a laser scattering diffraction apparatus (manufactured by Horiba, Ltd., apparatus name: LA-920).

(Crystallite Diameter XS)

For a crystallite diameter XS, an X-ray diffraction spectrum was measured by an X-ray diffractometer (manufactured by Rigaku Co., apparatus name: TTR-III), and the crystallite diameter XS was calculated from a half value width of an obtained (111) surface by the following formula.

crystallite diameter $XS$ (nm)=(Scherrer constant×X-ray wavelength (m))/(half value width (2θ)×cos diffraction angle)/10

(Absorbances (I, I') and Absorbance Ratio (I/I'))

Measurement was performed by using an IR measurement apparatus (manufactured by Thermo Fisher Scientific Inc., apparatus name: Nicolet 6700), with a measurement resolution being set at 4 cm$^{-1}$, by a diffused reflection method. As a detector, MCT-A (light is reduced by a mesh A) was used, and an Al mirror was used for background measurement. A value of an absorbance of 3566 cm$^{-1}$, with an absorbance of 3900 cm$^{-1}$ of an obtained profile being a base, was represented by I, and a value of an absorbance of 3695 cm$^{-1}$ was represented by I'. Then, an absorbance ratio (I/I') of absorption peaks was calculated.

(Lattice Constant)

By using a powder X-ray diffractometer (manufactured by Rigaku Co., apparatus name: SmartLab), X-ray diffraction spectra were measured, with incident angles of X-rays being changed from 10° to 90° at a speed of 5°/min. Tungsten was used for a filament, and Kα (λ=1.54056 A (angstrom)) of Cu was used for the X-ray. The lattice constant (a) was found by using a formula below using 2θ attributed to a cerium oxide (200) surface. Note that "n" represents the number of diffraction as described above.

$a = n\lambda / 2 \sin \theta$

Further, as the theoretical lattice constant (a'), a value found on the basis of the data of the X-ray diffraction peak of the standard aspect of the sample with a guaranteed lattice constant was used. As the data of the X-ray diffraction peak, total powder X-ray diffraction analysis software PDXL 2.0 (manufactured by Rigaku Co., data base No. 01-078-5328) was used. Then, by using the lattice constant (a) found above and the theoretical value (a') of the lattice constant, the deviation value B (%) from the theoretical value of the lattice constant was calculated by a formula below.

$B(\%) = (1 - a/a') \times 100$

Further, in preparation of the polishing agents of the examples 1 to 10, as a homogenizer, US-600TCVP (apparatus name) manufactured by NIHONSEIKI Co. Ltd. was used, and as a wet jet mill, Star Burst Mini (apparatus name) manufactured by Sugino Machine Ltd was used.

Example 1

A colloidal ceria (manufactured by Rhodia, trade name: HC60, concentration of cerium oxide particles: 30%, average primary particle diameter: 85 nm) (500 g) was dried in a thermostatic oven of 70° C. for three days. An obtained dried material was ground into a powder shape in a mortar and thereafter put into a crucible, and a heating processing was carried out at 690° C. for five hours in a firing furnace. Next, powder after the heating processing was roughly crushed in a mortar, 948.5 g of pure water and 1.5 g of a nitric acid solution of 1% were added in relation to 50 g of the powder, and preparation was performed so that an entire amount became 1000 g. Then, after an obtained slurry was dispersing processed by a homogenizer, a wet jet mill was used in order to further improve dispersibility, with a pressure being set at 200 MPa, to carry out a processing until $D_{50}$ of an secondary particle diameter became 100 nm. To 250 g of the slurry (1) obtained as above, 4750 g of pure water was added and mixed, to obtain a polishing agent (1). An average secondary particle diameter D' of the polishing agent (1) was measured by the above-described method.

Further, the above-described slurry (1) was re-dried at 70° C. for three days, to obtain cerium oxide particles. An average primary particle diameter D, a crystallite diameter XS, absorbances (I, I') of absorption peaks in IR, and a lattice constant (a) and a deviation value B (%) from a theoretical value of the lattice constant of the cerium oxide particles obtained as above were measured by the above-described methods. Measurement results of the average primary particle diameter D, the crystallite diameter XS, and the absorbances (I, I') of the absorption peaks in IR are shown in Table 1. Further, measurement results of the lattice constant (a) and the average secondary particle diameter D' are shown in Table 2.

Example 2

A colloidal ceria (manufactured by Rhodia, trade name: HC42, concentration of cerium oxide particles: 30%, average primary particle diameter: 55 nm) (500 g) was dried in a thermostatic oven of 70° C. for three days. An obtained dried material was ground into a powder shape in a mortar and thereafter put into a crucible, and a heating processing was carried out at 690° C. for five hours in a firing furnace. Next, powder after the heating processing was roughly crushed in a mortar, 948.5 g of pure water and 1.5 g of a nitric acid solution of 1% were added in relation to 50 g of the powder, and preparation was performed so that an entire amount became 1000 g. Then, after an obtained slurry was dispersing processed by a homogenizer, a wet jet mill was used in order to further improve dispersibility, with a pressure being set at 200 MPa, to carry out a processing until $D_{50}$ of an secondary particle diameter became 90 nm. To 250 g of the slurry (2) obtained as above, 4750 g of pure water was added and mixed, to obtain a polishing agent (2).

Further, the slurry (2) was re-dried at 70° C. for three days, to obtain cerium oxide particles. An average primary particle diameter D, a crystallite diameter XS, and absorbances (I, I') of absorption peaks in IR of the cerium oxide particles obtained as above were measured by the above-described methods. Measurement results are shown in Table 1.

Example 3

A colloidal ceria (manufactured by Rhodia, trade name: HC30, concentration of cerium oxide particles: 30%, average primary particle diameter: 42 nm) (500 g) was dried in a thermostatic oven of 70° C. for three days. An obtained dried material was ground into a powder shape in a mortar and thereafter put into a crucible, and a heating processing was carried out at 690° C. for five hours in a firing furnace. Next, powder after the heating processing was roughly crushed in a mortar, 948.5 g of pure water and 1.5 g of a nitric acid solution of 1% were added in relation to 50 g of the powder, and preparation was performed so that an entire amount became 1000 g. Then, after an obtained slurry was dispersing processed by a homogenizer, a wet jet mill was used in order to further improve dispersibility, with a pressure being set at 200 MPa, to carry out a processing until $D_{50}$ of an secondary particle diameter became 80 nm. To 250 g of the slurry (3) obtained as above, 4750 g of pure water was added and mixed, to obtain a polishing agent (3).

Further, the slurry (3) was re-dried at 70° C. for three days, to obtain cerium oxide particles. An average primary particle diameter D, a crystallite diameter XS, and absorbances (I, I') of absorption peaks in IR of the cerium oxide particles obtained as above were measured by the above-described methods. Measurement results are shown in Table 1.

Example 4

To 500 g of a colloidal ceria (manufactured by Rhodia, trade name: HC60), an injecting colliding processing was performed once by using a wet jet mill, with a pressure being set at 200 MPa. To 41.6 g of a slurry (4) obtained as above, 4958.4 g of pure water was added and mixed, to obtain a polishing agent (4).

Further, the slurry (4) was re-dried at 70° C. for three days, to obtain cerium oxide particles. An average primary particle diameter D, a crystallite diameter XS, and absorbances (I, I') of absorption peaks in IR of the obtained cerium oxide particles were measured by the above-described methods. Measurement results are shown in Table 1.

Example 5

To 500 g of a colloidal ceria (manufactured by Rhodia, trade name: HC60), injecting colliding processings were performed ten times by using a wet jet mill, with a pressure being set at 200 MPa. Next, to 41.6 g of a slurry (5) obtained as above, 4958.4 g of pure water was added and mixed, to obtain a polishing agent (5). An average secondary particle diameter D' of the obtained polishing agent (5) was measured by the above-described method.

Further, the slurry (5) was re-dried at 70° C. for three days, to obtain cerium oxide particles. An average primary particle diameter D, a crystallite diameter XS, and absorbances (I, I') of absorption peaks in IR, and a lattice constant (a) and a deviation value B (%) from a theoretical value of the lattice constant of the cerium oxide particles obtained as above were measured by the above-described methods. Measurement results of the average primary particle diameter D, the crystallite diameter XS, and the absorbances (I, I') of the absorption peaks in IR are shown in Table 1. Further, measurement results of the lattice constant (a) and the average secondary particle diameter D' are shown in Table 2.

Example 6

To 41.6 g of a colloidal ceria (manufactured by Rhodia, trade name: HC60), 4958.4 g of pure water was added and mixed, to obtain a polishing agent (6). Here, an average secondary particle diameter D' of the colloidal ceria was measured by the above-described method. Next, the above-described colloidal ceria was dried at 70° C. for three days, to obtain cerium oxide particles, and thereafter, an average primary particle diameter D, a crystallite diameter XS, and absorbances (I, I') of absorption peaks in IR, and a lattice constant (a) and a deviation value B (%) from a theoretical value of the lattice constant of the obtained cerium oxide particles were measured by the above-described methods. Measurement results of the average primary particle diameter D, the crystallite diameter XS, and the absorbances (I, I') of the absorption peaks in IR are shown in Table 1. Further, measurement results of the lattice constant (a) and the average secondary particle diameter D' are shown in Table 2.

Example 7

To 41.6 g of a colloidal ceria (manufactured by Rhodia, trade name: HC42), 4958.4 g of pure water was added and mixed, to obtain a polishing agent (7). Further, the above-described colloidal ceria was dried at 70° C. for three days, to obtain cerium oxide particles, and thereafter, an average primary particle diameter D, a crystallite diameter XS, and absorbances (I, I') of absorption peaks in IR of the obtained cerium oxide particles were measured by the above-described methods. Measurement results are shown in Table 1.

Example 8

To 41.6 g of a colloidal ceria (manufactured by Rhodia, trade name: HC30), 4958.4 g of pure water was added and mixed, to obtain a polishing agent (8). Further, the above-described colloidal ceria was dried at 70° C. for three days, to obtain cerium oxide particles, and thereafter, an average primary particle diameter D, a crystallite diameter XS, and absorbances (I, I') of absorption peaks in IR of the obtained cerium oxide particles were measured by the above-described methods. Measurement results are shown in Table 1.

Example 9

To 100 g of a cerium carbonate, 400 g of water was added, and thereto 75 g of zirconia balls of 1 mm in diameter was added and grinding was performed for 15 hours, and thereafter, an obtained slurry was dried in a thermostatic oven of 70° C. for three days. An obtained dried material was ground into a powder shape in a mortar and thereafter put into a crucible, and a heating processing was carried out at 300° C. for five hours in a firing furnace.

Next, powder after the heating processing was roughly crushed in a mortar, 948.5 g of pure water and 10 g of a nitric acid solution of 1% were added in relation to 50 g of the powder, and preparation was performed so that an entire amount became 1000 g. Then, after an obtained slurry was dispersing processed by a homogenizer, a wet jet mill was used in order to further improve dispersibility, with a pressure being set at 200 MPa, to carry out a processing until $D_{50}$ of a secondary particle diameter became 180 nm. Next, to 250 g of the obtained slurry (9), 4750 g of pure water was added and mixed, to obtain a polishing agent (9). An average secondary particle diameter D' of the polishing agent (9) was measured by the above-described method. Further, after the polishing agent (9) was dried at 70° C. for three days and cerium oxide particles were obtained, a lattice constant (a) and a deviation value B (%) from a theoretical value of the lattice constant were measured by the above-described method. Measurement results of the lattice constant (a) and the average secondary particle diameter D' are shown in Table 2.

Example 10

To 100 g of a cerium carbonate, 400 g of water was added, and thereto 75 g of zirconia balls of 1 mm in diameter was added and grinding was performed for 15 hours, and thereafter, an obtained slurry was dried in a thermostatic oven of 70° C. for three days. An obtained dried material was ground into a powder shape in a mortar and thereafter put into a crucible, and a heating processing was carried out at 300° C. for five hours in a firing furnace.

Next, powder after the heating processing was roughly crushed in a mortar, 948.5 g of pure water and 1.79 g of a nitric acid solution of 1% were added in relation to 50 g of the powder, and preparation was performed so that an entire amount became 1000 g. Then, after an obtained slurry was dispersing processed by a homogenizer, a wet jet mill was used in order to further improve dispersibility, with a pressure being set at 200 MPa, to carry out a processing until $D_{50}$ of a secondary particle diameter became 180 nm. Next, to 250 g of the obtained slurry (10), 4750 g of pure water was added and mixed, to obtain a polishing agent (10). An average secondary particle diameter D' of the polishing agent (10) was measured by the above-described method. Further, after the polishing agent (10) was dried at 70° C. for three days and cerium oxide particles were obtained, a lattice constant (a) and a deviation value B (%) from a theoretical value of the lattice constant were measured by the above-described method. Measurement results of the lattice constant (a) and the average secondary particle diameter D' are shown in Table 2.

TABLE 1

| | Colloidal ceria trade name | Processing content | IR absorbance I (wave number 3566 cm$^{-1}$) | IR absorbance I' (wave number 3695 cm$^{-1}$) | Crystallite diameter XS (nm) | Average primary particle diameter D (nm) |
|---|---|---|---|---|---|---|
| Example 1 | HC60 | Heating processing at 690° C. | 0.554 | 0.357 | 42 | 85 |
| Example 2 | HC42 | Heating processing at 690° C. | 0.573 | 0.311 | 30 | 55 |
| Example 3 | HC30 | Heating processing at 690° C. | 0.595 | 0.288 | 27 | 42 |
| Example 4 | HC60 | Jet mill processing once | 0.679 | 0.211 | 44 | 85 |
| Example 5 | HC60 | Jet mill processing 10 times | 0.499 | 0.198 | 45 | 85 |
| Example 6 | HC60 | No processing | 0.671 | 0.190 | 43 | 85 |
| Example 7 | HC42 | No processing | 0.579 | 0.070 | 32 | 55 |
| Example 8 | HC30 | No processing | 0.592 | 0.205 | 27 | 42 |

TABLE 2

| | Abrasive particle | Processing content | Lattice constant a (angstrom) | Average secondary particle diameter D' (nm) |
|---|---|---|---|---|
| Example 1 | CeO$_2$ | Heating processing at 690° C. | 5.4100 | 100 |
| Example 5 | CeO$_2$ | Jet mill processing 10 times | 5.4180 | 100 |
| Example 6 | CeO$_2$ | No processing | 5.4196 | 100 |
| Example 9 | CeO$_2$ | Heating processing at 300° C. | 5.4211 | 180 |
| Example 10 | CeO$_2$ | Heating processing at 690° C. | 5.4126 | 180 |

Next, polishing characteristics of the polishing agents (1) to (10) obtained in the examples 1 to 10 were evaluated by a method described below.

(Evaluation of Polishing Characteristic)

Experiments to measure polishing rates are carried out in order to evaluate polishing characteristics.

<Object to be Polished>

As a patterned object to be polished, an STI pattern wafer (manufactured by International SEMATECH, trade name: 864CMP000) was used. A wafer size was 8 inches, and in the wafer had been formed a plurality of stripe patterns modeling after a pattern of STI, with a pattern width of 0.5 µm or more to 500 µm or less and a pattern density of 10% or more to 90% or less, at a pattern interval of 100 µm. In the STI pattern wafer, a film thickness of an SiN film formed as a mask on an active region was 90 nm, and a depth of a trench was 350 nm. The entire surface of the wafer had been covered by a silicon dioxide film of a thickness of 500 nm which was film-formed from tetraethoxysilane, by plasma CVD.

<Polishing Machine and Polishing Condition>

As a polishing machine, a fully automatic CMP apparatus (manufactured by Applied Materials, Inc., apparatus name: Mirra) was used. As a polishing pad, a double layer pad (manufactured by Rodel, Inc., trade name: K-groove, IC-1400) was used, and conditioning was carried out by using a diamond disk (manufactured by 3M Company, trade name: A165). Polishing was performed for two minutes with a flow rate of a polishing agent being 200 cm$^3$/min, a number of rotation of a polishing platen being 77 rpm, and a polishing pressure being 3 psi.

Measurement of the polishing rate was carried out by measuring a film thickness of a part described below of the STI pattern wafer being the object to be polished by using an optical thicknessmeter (manufactured by KLA-Tencor Corporation, apparatus name: UV-1280SE). From film thicknesses before and after polishing of a silicon dioxide film of an active region (element region) of a pattern forming part constituted by a trench region of a width of 50 µm and an active region of a width of 50 µm in the above-described STI pattern wafer, the polishing rate was calculated by the following formula.

polishing rate $V_1$ (nm/min)=(thickness (nm) before polishing–thickness (nm) after 2-minute polishing)/2 min Next, by dividing the obtained polishing rate $V_1$ by a surface area per one cerium oxide particle contained in the polishing agent, a polishing rate $V_2$ per unit surface area of the cerium oxide particle was calculated. Note that the surface area per one cerium oxide particle was found by the following formula.

surface area of cerium oxide particle=$4\pi\times$(average primary particle diameter ($D$) of cerium oxide particle/2)$^2$ Further, the absorbance ratio (I/I') of the absorption peaks obtained above was divided by the crystallite diameter XS, and an absorbance per crystallite diameter (I/I')/XS, was calculated. The polishing rate $V_2$ per unit surface area described above is shown in Table 3 together with the absorbance ratio per crystallite diameter (I/I')/XS.

TABLE 3

| | Colloidal ceria trade name | Processing content | (I/I')/XS | Polishing rate per unit surface area of particle ($10^{-3}$ nm/min) |
|---|---|---|---|---|
| Example 1 | HC60 | Heating processing at 690° C. | 0.037 | 8.06 |
| Example 2 | HC42 | Heating processing at 690° C. | 0.061 | 7.15 |
| Example 3 | HC30 | Heating processing at 690° C. | 0.077 | 2.87 |
| Example 4 | HC60 | Jet mill processing once | 0.073 | 9.07 |
| Example 5 | HC60 | Jet mill processing 10 times | 0.056 | 9.07 |
| Example 6 | HC60 | No processing | 0.082 | 2.01 |
| Example 7 | HC42 | No processing | 0.258 | 2.38 |
| Example 8 | HC30 | No processing | 0.107 | 1.67 |

From the results in Table 3, it is found that when the polishing agents of the examples 1 to 5 are used, the absorbance ratio per crystallite diameter (I/I')/XS being 0.08 or less, the polishing rate $V_2$ per unit surface area is improved compared with a case where the poling agents of the examples 6 to 8 in which the absorbance ratio is larger than 0.08 is used.

Further, the polishing rates $V_1$ obtained by using the polishing agents (1), (5), (6), (9), and (10) of the example 1, examples 5 to 6, and the examples 9 to 10 are shown in Table 4 together with deviation values B (%) from the theoretical values of the lattice constants obtained above for the cerium oxide particles in the respective polishing agents.

TABLE 4

| | Abrasive particle | Processing content | Deviation value B from theoretical value of lattice constant $(1 - a/a') \times 100$ (%) | Polishing rate $V_1$ (nm/min) |
|---|---|---|---|---|
| Example 1 | $CeO_2$ | Heating processing at 690° C. | 0.0294 | 231 |
| Example 5 | $CeO_2$ | Jet mill processing 10 times | −0.1421 | 260 |
| Example 6 | $CeO_2$ | No processing | −0.1766 | 58 |
| Example 9 | $CeO_2$ | Heating processing at 300° C. | −0.2050 | 40 |
| Example 10 | $CeO_2$ | Heating processing at 690° C. | 0.1579 | 260 |

From the results in Table 4, it is found that when the polishing agents (1), (5), and (10) of the examples 1, 5, and 10 are used, the deviation value B from the theoretical value of the lattice constant being −0.16% or more, the polishing rate $V_1$ is improved compared with a case where the poling agents (6), (9) of the examples 6, 9 in which the deviation value B is smaller than −0.16% is used.

According to the present invention, it is possible to suppress occurrence of a polishing defect to a surface to be polished which includes a film of a silicon oxide, a silicon oxide containing carbon, a silicon nitride, a silicon oxynitride, a silicon carbide, amorphous silicon, polysilicon, or the like, and to polish at a high polishing rate. Therefore, it is possible to perform planarization of an insulation film for STI, for example, at a high polishing rate while suppressing occurrence of the polishing defect, so that a manufacturing efficiency of the semiconductor device can be heightened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A polishing agent comprising:
cerium oxide particles; and
water,
wherein, in said cerium oxide particle, a value A found by a formula below from a ratio (I/I') between a value I of an absorbance of 3566 $cm^{-1}$ and a value I' of an absorbance of 3695 $cm^{-1}$, with an absorbance of 3900 $cm^{-1}$ of an infrared absorption spectrum as a criterion, and a crystallite diameter XS measured by X-ray diffraction is 0.08 or less $A=(I/I')/XS$.

2. The polishing agent according to claim 1,
wherein the crystallite diameter XS of said cerium oxide particle is 20 nm or more to 60 nm or less.

3. The polishing agent according to claim 1,
wherein in said cerium oxide particle, a ratio (XS/D) between the crystallite diameter XS and an average primary particle diameter D obtained by a scanning electron microscope is 0.4 or more to 1.0 or less.

4. The polishing agent according to claim 3,
wherein the average primary particle diameter D of said cerium oxide particles is 30 nm or more to 100 nm or less.

5. A polishing agent comprising:
cerium oxide particles; and
water,
wherein, in said cerium oxide particle, a deviation B of a lattice constant found by a formula below from a theoretical lattice constant (a') and a lattice constant (a) measured by powder X-ray diffraction is −0.16% or more, and an average secondary particle diameter D' of said cerium oxide particles is 90 nm or more to 500 nm or less $B(\%)=(1-a/a')\times100$.

6. The polishing agent according to claim 5,
wherein the average secondary particle diameter D' of said cerium oxide particles is 95 nm or more to 250 nm or less.

7. The polishing agent according to claim 5,
wherein the average secondary particle diameter D' of said cerium oxide particles is 95 nm or more to 200 nm or less.

8. A polishing method comprising polishing by a relative motion between a surface to be polished and a polishing pad which are brought into contact with each other while a polishing agent is supplied to the polishing pad,
wherein the polishing agent according to claim 1 is supplied to the polishing pad.

9. A polishing method comprising polishing by a relative motion between a surface to be polished and a polishing pad which are brought into contact with each other while a polishing agent is supplied to the polishing pad,
  wherein the polishing agent according to claim 5 is supplied to the polishing pad.

10. A manufacturing method of a semiconductor integrated circuit device, comprising a step of polishing the surface to be polished by the polishing method according to claim 8.

11. A manufacturing method of a semiconductor integrated circuit device, comprising a step of polishing the surface to be polished by the polishing method according to claim 9.

* * * * *